United States Patent
Yang et al.

(10) Patent No.: US 7,649,234 B2
(45) Date of Patent: Jan. 19, 2010

(54) SEMICONDUCTOR DEVICES

(75) Inventors: Hongning Yang, Chandler, AZ (US);
Jiang-Kai Zuo, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/129,861

(22) Filed: May 30, 2008

(65) Prior Publication Data
US 2008/0224237 A1  Sep. 18, 2008

Related U.S. Application Data

(62) Division of application No. 11/189,587, filed on Jul. 25, 2005, now Pat. No. 7,393,752.

(51) Int. Cl.
*H01L 21/336* (2006.01)
(52) U.S. Cl. .......... 257/408; 438/525; 438/527
(58) Field of Classification Search ........ 257/257, 257/E21.417–E21.42, 296–304, 305, 306, 257/307, E29.256–E29.261, 408, 549–550, 257/E29.266–E29.269, E29.278–E29.279; 438/286
See application file for complete search history.

(56) References Cited

U.S. PATENT DOCUMENTS 5,716,866 A  2/1998  Dow et al.
6,020,227 A *  2/2000  Bulucea .............. 438/194
6,599,804 B2 *  7/2003  Bulucea et al. ......... 438/301
2001/0019869 A1 *  9/2001  Hsu .................... 438/286

OTHER PUBLICATIONS

Buti et al., "A New Asymmetrical Halo Source Gold Drain (HS-Gold) Deep Sub-Half-Micrometer n-Mosfet Design for Reliability and Performance," IEEE Transactions on Electron Devices, vol. 38, No. 8, Aug. 1991, pp. 1757-1764.

* cited by examiner

*Primary Examiner*—N Drew Richards
*Assistant Examiner*—Swapneel Chhaya
(74) *Attorney, Agent, or Firm*—Ingrassia, Fisher & Lorenz, P.C.

(57) ABSTRACT

An embodiment of a semiconductor device includes a gate electrode overlying a substrate and a lightly doped epitaxial layer formed on the substrate. A high energy implant region forms a well in a source side of the lightly doped epitaxial layer. A self-aligned halo implant region is formed on a source side of the device and within the high energy well implant. An implant region on a drain side of the lightly doped epitaxial layer forms a gate overlapped LDD (GOLD). A doped region within the halo implant region forms a source. A doped region within the gate overlapped LDD (GOLD) forms a drain.

18 Claims, 3 Drawing Sheets

SEMICONDUCTOR DEVICES

RELATED APPLICATION

This application is a divisional of U.S. patent application Ser. No. 11/189,587, filed Jul. 25, 2005.

TECHNICAL FIELD

The present invention generally relates to semiconductor devices, and more particularly relates to deep submicron field effect transistors having low Rdson.

BACKGROUND

Processing technologies and device structures for forming integrated circuits (ICs) are implemented by using a plurality of interconnected field effect transistors (FETs), also called metal oxide semiconductor field effect transistors (MOSFETs), or simply MOS transistors. A typical MOS transistor includes a gate electrode as a control electrode and spaced apart source and drain electrodes between which a current can flow. A control voltage applied to the gate electrode controls the flow of current through a channel between the source and drain electrodes. As the complexity of the integrated circuits increases, more and more MOS transistors are needed to implement the integrated circuit function. Thus, it becomes important to reduce the size of individual MOS transistors to achieve an integrated circuit that is reasonably sized and reliably manufacturable. Most importantly, reducing the size of IC increases the number of IC chips per wafer, which has become the most effective approach to reduce manufacture cost in semiconductor IC industry.

Wireless applications typically use a 4.5-5.5 V power MOSFET, when a ~5V operational level is needed to preserve both signal swing range and signal-to-noise ratios. The requirement for deep submicron ~5V power MOSFETs in 0.13 μm technology are the following: (1) low Rdson and high drive current (more than 50% scaling); (2) low off-state leakage current <1-10 pA/μm; (3) high reliability against hot carrier injection (HCI) damage; and (4) the restriction of process flows to 0.18 μm or 0.13 μm CMOS platforms.

Under current conditions, the manufacture of deep submicron ~5V power MOSFETs in 0.13 μm technology platform could face major challenges if conventional structures widely used for 0.5 μm (or above) platforms are adopted. For instance, conventional spacer-based MOSFETs with a lightly doped drain (LDD) have a channel length limit of ~0.5 μm due to reliability issues caused by HCI damage. To sufficiently reduce the damage when operated at 5V, the gate length would have to increase to 0.5 μm or above. In addition, conventional halo-source (HS-GOLD) and gate-overlapped LDD drain (GOLD) MOSFETs can be shrunk down to deep submicron, but the operation voltage has to be lowered below 3.5 V due to both HCI and punchthrough issues. Better HCI performance requires longer GOLD, which requires extra thermal drive-in cycles. This is not possible in the 0.13 μm CMOS process flow where the thermal budget is very limited.

Conventional LDMOS (Lateral double diffused MOS) can operate at a higher voltage, however, two major difficulties in the fabrication process prevent the scaling down of an LDMOS to deep submicron region. In one type of LDMOS processing, the channel length is defined by non-self-aligned ion implant. To meet lithography requirements for misalignment tolerances, a sufficient margin has to be considered, which sets a limit of ~0.5 μm for this type of LDMOS. In a second type of LDMOS processing, the channel doping is carried out first by a self-aligned implantation with poly gate serving as a mask, and then by subsequent thermal drive-in to diffuse the dopant into the channel. Although this type of LDMOS provides a smaller device, the use of an extra thermal drive-in cycle is not compatible with standard 0.13 μm CMOS process flow where thermal budget is very limited. Typically this type of LDMOS may not be fabricated in any advanced CMOS-based technology platform.

It is concluded that conventional structures for ~5V MOSFETs used in 0.5 μm platforms are not capable of scaling to below 0.5 μm either due to fabrication processing issues (thermal budget or misalignment) or due to device reliability issues (HCI or punchthrough). Accordingly, it is desirable to provide a new type of deep submicron semiconductor device, and more particularly deep submicron power MOSFET with an operation voltage of ~5V. In addition, it is desirable to provide a method for fabricating a deep submicron power MOSFET that allows for operation in the ~5V range without incurring any additional process steps when building in the 0.13 μm technology platform. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements, and wherein.

DETAILED DESCRIPTION

The following detailed description of the invention is merely exemplary in nature and is not intended to limit the invention or the application and uses of the invention. Furthermore, there is no intention to be bound by any theory presented in the preceding background of the invention or the following detailed description of the invention.

Figure 1:
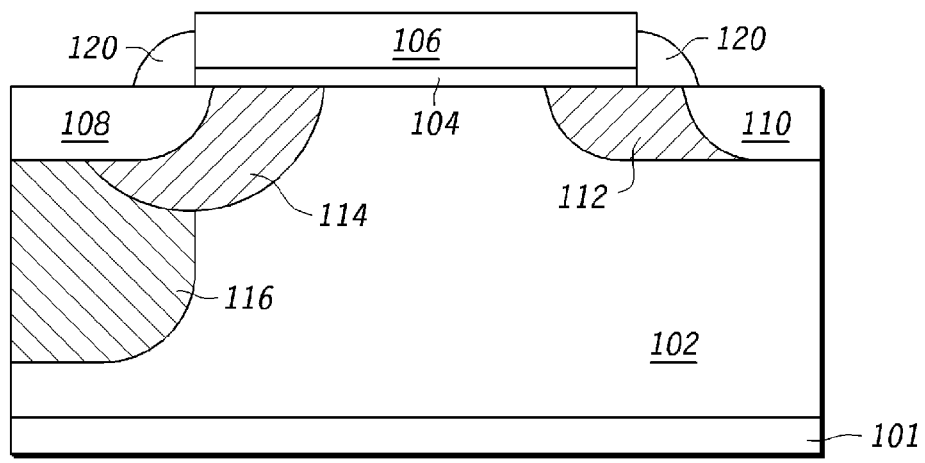
FIG. 1 illustrates schematically, in cross section, a semiconductor device in accordance with an exemplary embodiment of the invention.

FIG. 1 illustrates schematically, in cross section, an MOS transistor 100 in accordance with an embodiment of the invention. MOS transistor 100 includes a very lightly doped epitaxial (EPI) layer 102 formed on a surface of a silicon substrate 101. A gate insulator 104 is formed on the EPI surface. A gate electrode 106 is formed on gate insulator 104. A source region 108 and a drain region 110 are formed in epitaxial layer 102 by introducing appropriate impurity determining dopants such as arsenic or phosphorus for an n-channel MOS transistor or boron for a p-channel MOS transistor. A gate overlapped LDD (GOLD) region 112 is formed at drain 110. A halo (punchthrough) implant region 114 is formed at source 108. By separating GOLD region 112 and halo implant region 114, independent optimization for the hot carrier reliability and the resistance to surface (channel) punchthrough due to the drain induced barrier lowering (DIBL) effects is achieved.

MOS transistor 100 further comprises a p-well 116 formed and aligned at the source side edge of a gate electrode 106. A plurality of spacers 120 are provided about gate electrode 106. The use of a very lightly doped epitaxial layer 102 in MOS transistor 100 significantly enhances the resistance to HCI damage while the addition of p-well 116 prevents the bulk punchthrough between source and drain. By combining the side p-well with the source side halo implant region, both surface and bulk punchthrough are prevented and the off-state leakage current at Vd~5V is significantly reduced. MOS transistor 100 is fabricated as a deep submicron (<0.3 μm) ~5V power MOSFET in advanced 0.13 μm technology. The fabrication is cost-effective because no additional process steps or mask layers beyond those used in standard 0.13 μm process flows are required. From the novel structure, an ultra low Rdson can be obtained while the leakage current remains low.

FIGS. 2-8 illustrate method steps for manufacturing a semiconductor device such as MOS transistor 100, in accordance with one embodiment of the invention. FIGS. 2-8 illustrate specific types and levels of doping for MOS transistor 100. It should be understood that reverse doping types and varying doping levels are anticipated by this disclosure. MOS transistor 100 as illustrated in FIGS. 2-8 is an N-channel MOS transistor, although similar method steps can be used to manufacture a P-channel MOS transistor with appropriate changes in impurity determining dopant types. Likewise, similar method steps can be used to manufacture complementary MOS (CMOS) transistors. Various steps in the manufacture of MOS transistors are well known and so, in the interest of brevity, many conventional steps will only be mentioned briefly herein or will be omitted entirely without providing the well known process details. Although the term "MOS device" properly refers to a device having a metal gate electrode and an oxide gate insulator, that term will be used throughout to refer to any semiconductor device that includes a conductive gate electrode that is positioned over a gate insulator (whether oxide or other insulator) which, in turn, is positioned over a semiconductor substrate.

Figure 2:
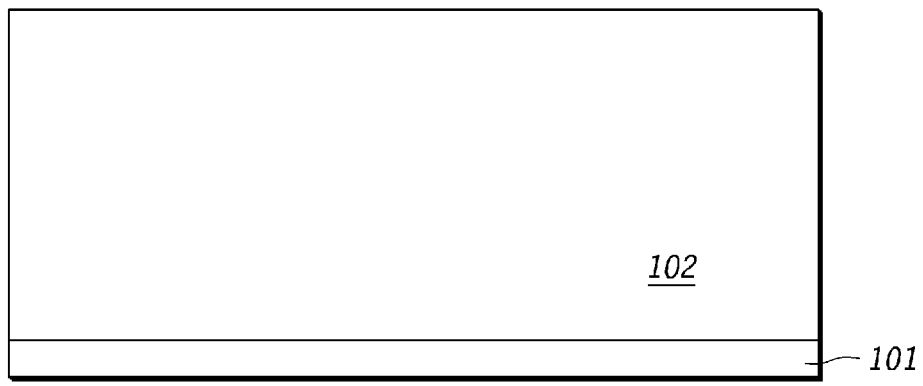
FIGS. 2-8 illustrate schematically, in cross section, method steps in accordance with an exemplary embodiment of the invention for fabricating the semiconductor device of FIG. 1.

FIG. 2 illustrates the manufacture of MOS transistor 100 in accordance with an embodiment of the invention wherein the process begins with providing semiconductor substrate 101 having lightly doped epitaxial layer 102 formed thereon. In this preferred embodiment, epitaxial layer 102 is very lightly p-doped, such as with boron to a concentration of between $\sim 2 \times 10^{14}/cm^3$ and $\sim 2 \times 10^{15}/cm^3$. Epitaxial layer 102 provides improved HIC suppression, when compared with a typical P-substrate.

Figure 3:
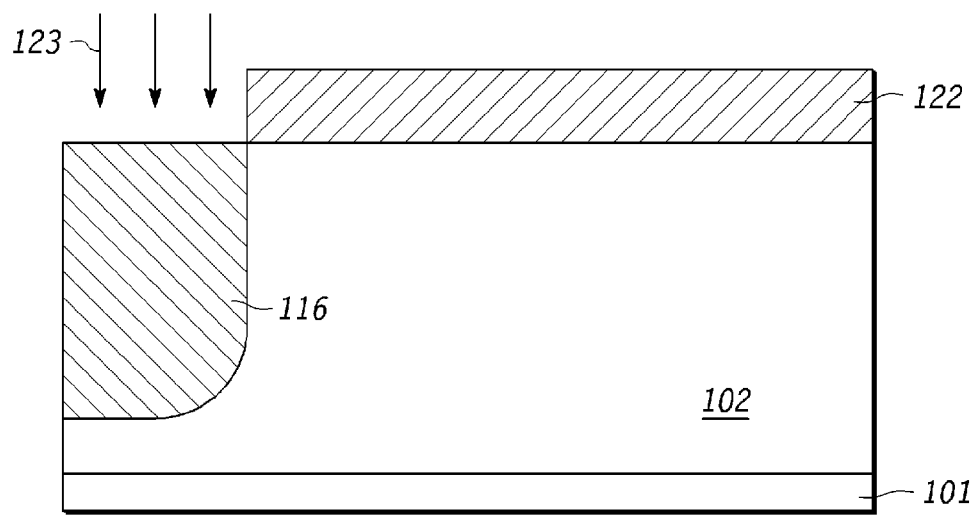

FIG. 3 illustrates the fabrication of P-well 116. P-well 116 is formed by high energy implant of boron (as indicated by arrows 123) when forming NMOS 100. In an alternative embodiment, p-well 116 is replaced by n-well that is formed by high energy implant of phosphorus to form a PMOS. P-well 116 is doped to an approximate concentration in a range of $1 \times 10^{17}/cm^3$ to $8 \times 10^{17}/cm^3$, wherein the higher the doping concentration the better the ability for p-well 116 to prevent bulk punchthrough. To prepare for the high energy implant of p-well 116, a layer of photoresist 122, as illustrated in FIG. 3, is deposited on a portion of epitaxial layer 102. Once p-well 116 has been formed, photoresist 122 is removed.

Figure 4:
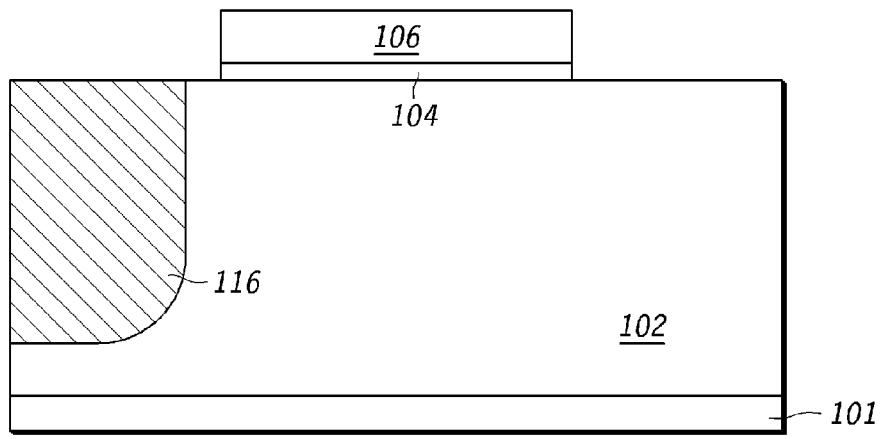

FIG. 4 illustrates gate insulator 104 formed on a surface of lightly doped epitaxial layer 102. Gate insulator 104 may be a thermally grown silicon dioxide formed by heating substrate 102 in an oxidizing ambient, or may be a deposited insulator such as a silicon oxide, silicon nitride, silicon oxynitride, a high dielectric constant insulator such as HfSiO, or the like. Deposited insulators can be deposited by chemical vapor deposition (CVD), low pressure chemical vapor deposition (LPCVD), plasma enhanced chemical vapor deposition (PECVD), or atomic layer deposition (ALD). Gate insulator 104 is typically 1-50 nanometers (nm) in thickness depending on gate and drain operation voltage.

In accordance with one embodiment of the invention, a layer, preferably of polycrystalline silicon, is next deposited onto gate insulator 104. The layer of polycrystalline silicon can be deposited as an impurity doped layer, but is preferably deposited as undoped polycrystalline silicon and is subsequently impurity doped by ion implantation. A hard mask material (not shown) such as silicon oxide, silicon nitride, or silicon oxynitride can be deposited onto the surface of the polycrystalline silicon to aid in subsequently patterning the polycrystalline silicon. The polycrystalline material can be deposited to a thickness of about 100 nm by LPCVD by the hydrogen reduction of silane ($SiH_4$). The hard mask material can be deposited to a thickness of about 50 nm, also by LPCVD.

The hard mask layer, underlying layer of polycrystalline silicon and underlying layer of gate insulator 104 are photolithographically patterned to form gate electrode 106 as illustrated in FIG. 4. Preferably gate electrode 106 has a width equal to the minimum line width allowable by the design rules being used to design the integrated circuit of which MOS transistor 100 is a part. The polycrystalline silicon and gate insulator can be etched in the desired pattern by, for example, plasma etching in a Cl or $HBr/O_2$ chemistry and the hard mask can be etched, for example, by plasma etching in a $CHF_3$, $CF_4$, or $SF_6$ chemistry.

Figure 5:
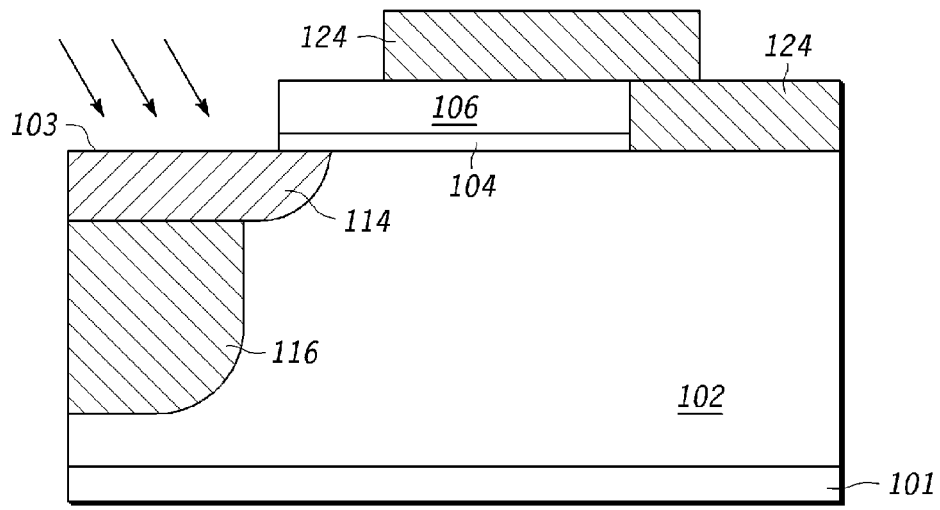

Referring now to FIG. 5, standard photolithography processing using a plurality of photoresists 124 and lithography steps are performed to provide for fabricating of halo implant region 114. Halo implant region 114 serves as a source extension in device 100. Following deposition of photoresists 124, MOS transistor 100 is subjected to an angled unidirectional ion implantation process. Preferably, the angled unidirectional ion implantation is performed using ions of the same doping material as epitaxial layer 102, such as germanium (Ge), arsenic (As), phosphorous (P), boron (B), and the like, except halo implant region 114 is more heavily doped than epitaxial layer 102. In this preferred embodiment halo implant region 114 is doped with boron ions to a concentration level in a range of $\sim 5E^{18}$ $cm^3$ to $\sim 6E^{18}$ $cm^3$. In this preferred embodiment the ion implantation process uses boron ions that are directed at a surface 103 (i.e., the surface closest to a source region) of MOS transistor 100 at an acute angle α from an axis that is perpendicular to surface 103 of epitaxial layer 102. Preferably, angle α is at least as great as about 7 degrees and is less than about 90 degrees. In this preferred embodiment, the tilted angle implant is performed between 45-60 degrees to form halo implant region 114. In this preferred embodiment, boron ions can be implanted at an energy of about 30 KeV and at an implant doping concentration of about $5 \times 10^{18}/cm^3$. It will be appreciated that, because the ion implantation is unidirectional and is oriented at an angle, ions will be implanted into the area of MOS transistor 100 that is exposed to or facing the source of the ions. The angled implant is directed to the source side of gate electrode 106 and forms a pocket area, referred to as the halo, due to gate electrode 106 serving as a mask. Gate electrode 106 further provides self-alignment of halo implant region 114. Halo implant region 114 is formed of the same doping material as epitaxial layer 102, except as previously stated halo implant region 104 is very heavily doped. Subsequent to the formation of halo implant region 114, a source extension (not shown) is formed of a phosphorus material that is implanted at 0 degree angle with an energy of about 30 KeV and at an implant doping concentration level in a range of $\sim 5 \times 10^{18}/cm^3$ to $\sim 6 \times 10^{18}/cm^3$. Next, photoresists 124 are removed.

Figure 6:
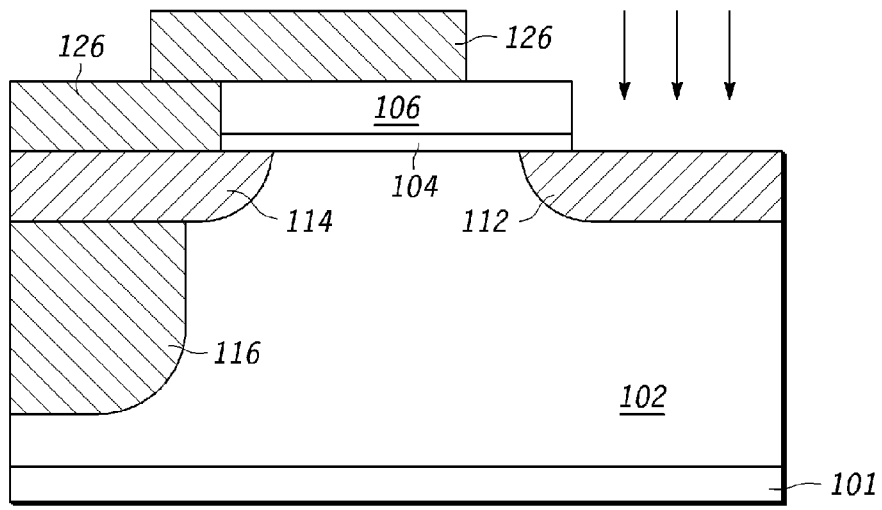

Referring now to FIG. 6, standard photolithography processing using a plurality of photoresists 126 and lithography steps are performed to provide for formation of self-aligned lightly doped drain (LDD) implant 112, on a drain side of device 100. LDD implant 112 is a gate-overlapped LDD (GOLD) and provides superior hot carrier reliability. LDD implant 112 is formed of a phosphorus material that can be implanted at an energy of about 30 KeV and at an implant doping concentration level in a range of $\sim 1 \times 10^{18}/cm^3$ to $\sim 6 \times 10^{18}$ cm$^3$. Gate electrode 106 serves as a mask during implant of LDD implant 112 and provides self alignment of LDD implant 112. Subsequent to the formation of LDD implant 112, photoresists 126 are removed.

Figure 7:
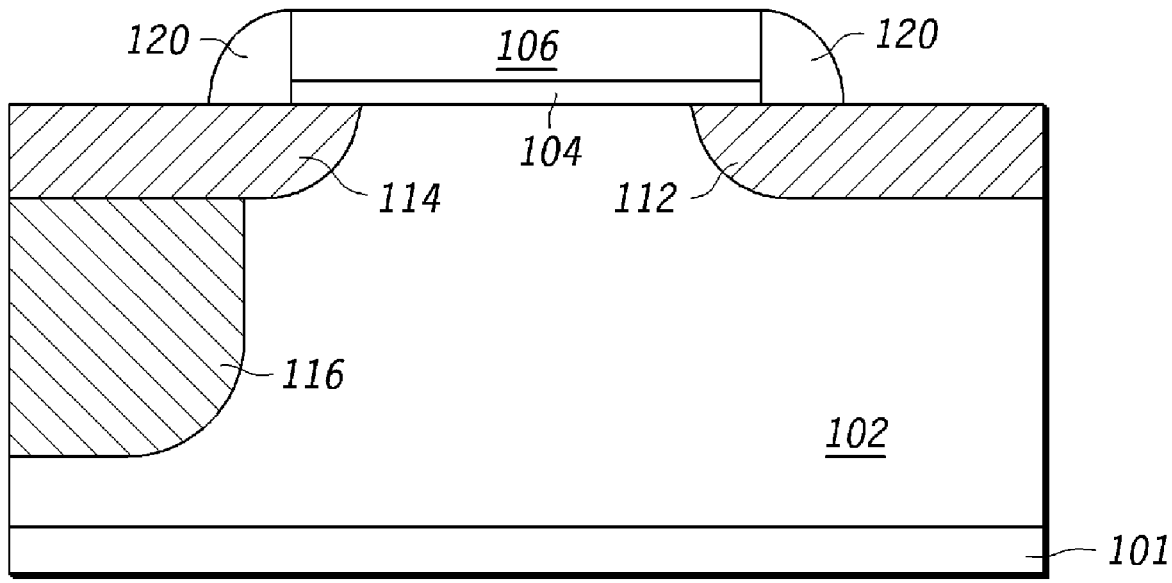

Following the patterning of gate electrode 106 and the formation of halo implant region 114 and LDD implant 112, a thin layer of nitride is deposited and etched about gate electrode 106 to form insulating spacers 120 as illustrated in FIG. 7. A rapid thermal anneal (RTA) step is next performed to improve the properties of device 100, and further diffuse LDD implant 112 into the channel area 128. It should be understood that during the rapid thermal anneal step, halo implant region 114 may also diffuse further into channel area 128. Channel area 128 is defined as the epitaxial layer region between source 108 and drain regions 110.

Figure 8:
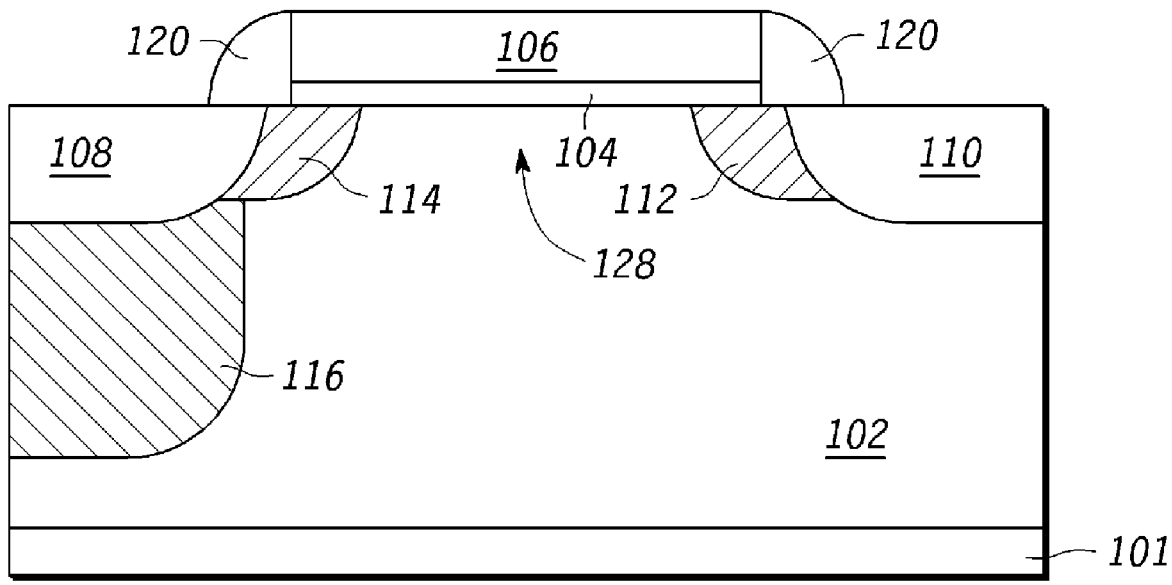

Gate electrode 106 and insulating spacers 120 can be used as an ion implantation mask to form source 108 and drain 110 regions in epitaxial layer 102, as illustrated in FIG. 8. By using gate electrode 106 and insulating spacers 120 as an ion implant mask, source region 108, drain region 110, and channel 128 are self aligned with gate electrode 106. For an N-channel MOS transistor the source and drain regions are preferably formed by implanting arsenic ions, although phosphorus ions could also be used. Source region 108 and drain region 110 are shallow and preferably have a junction depth of less than about 20 nm and most preferably less than about 5-10 nm and are heavily impurity doped to about 10 ohms per square.

Provided is a semiconductor device including a semiconductor substrate having a surface. The semiconductor device includes a doped epitaxial layer formed on the surface of the substrate, a gate electrode disposed overlying the doped epitaxial layer, a first impurity doped region disposed within the doped epitaxial layer and partially offset from the gate electrode, a second impurity doped region disposed within the first impurity doped region, a third impurity doped region disposed within the doped epitaxial layer and partially offset from the gate electrode, a source region formed in the second impurity doped region, and a drain region formed in the third impurity doped region. In a further embodiment, the doped epitaxial layer has a doping concentration of $2 \times 10^{15}/cm^3$. In a further embodiment, the first impurity doped region is a well region formed in the doped epitaxial layer and has a doping concentration in a range of $1 \times 10^{17}/cm^3$ to $8 \times 10^{17}/cm^3$. In a further embodiment, the second impurity doped region is a halo implant region and has a doping concentration in a range of $5 \times 10^{18}/cm^3$ to $6 \times 10^{18}/cm^3$. In a further embodiment, the third impurity doped region is a gate overlapped low doped drain (GOLD) and has a doping concentration in a range of $1 \times 10^{18}/cm^3$ to $5 \times 10^{18}/cm^3$. In a further embodiment, a doping material selected from the group consisting of germanium (Ge), arsenic (As), phosphorous (P), and boron (B) provides doping for the doped epitaxial layer, the first impurity doped region, the second impurity doped region, the third impurity doped region, the source region and the drain region.

In addition, provided is a semiconductor device that includes an epitaxial layer doped with a first type of doping material, a first doped well on a source side of the substrate, wherein the first doped well is impurity doped with the first type of doping material, a gate electrode overlying a surface of the substrate and having a gate dielectric formed therebetween, a halo implant region formed in self alignment with the gate electrode on the source side of the substrate and implanted using an impurity ion of the first type of doping material at an angle greater than zero from an axis perpendicular to the surface of the substrate, a lightly doped drain implant formed in self alignment with the gate electrode on a drain side of the substrate and impurity doped with a second type of doping material, a source region in the halo implant region, and a drain region in the lightly doped drain implant, wherein the halo implant region and the lightly doped drain implant extend beyond the source region and the drain region and into a channel area between the source region and the drain region. In a further embodiment, the first type of doping material includes ions that comprise a material selected from the group consisting of germanium (Ge), arsenic (As), phosphorous (P), and boron (B). In a further embodiment, the first doped well comprises boron implanted at an implant concentration of $1 \times 10^{15}/cm^3$. In a further embodiment, the semiconductor device of also includes a second doped well formed within a portion of the first doped well by chain implanting boron at energy of 15K to 500 KeV and at an implant concentration in a range of $1 \times 10^{17}/cm^3$ to $2 \times 10^{15}/cm^3$. In a further embodiment, the halo implant region comprises boron implanted at an energy of 30 KeV and at an implant concentration in a range of $5 \times 10^{18}/cm^3$ to $6 \times 10^{18}/cm^3$. In a further embodiment, the lightly doped drain implant comprises boron implanted at an energy of 30 KeV and at an implant concentration in a range of $1 \times 10^{18}/cm^3$ to $5 \times 10^{18}/cm^3$.

In addition, provided is a semiconductor device that includes a doped epitaxial layer on the surface of the substrate and doped with a first type of doping material, a doped well of the first type of doping material in the doped epitaxial layer and on a source side of the substrate, a gate electrode overlying a surface of the substrate and having a gate dielectric formed therebetween, a halo implant region formed in self alignment with the gate electrode on the source side of the substrate and implanted using an impurity ion of the first type of doping material at an angle greater than zero from an axis perpendicular to the surface of the substrate, a lightly doped drain implant formed in self alignment with the gate electrode on a drain side of the substrate and impurity doped with a second type of doping material, an insulating spacer formed about the gate electrode, a source region implanted in the halo implant region, and a drain region implanted in the lightly doped drain implant, wherein the halo implant region and the lightly doped drain implant extend beyond the source region and the drain region and into a channel area between the source region and the drain region. In a further embodiment, the first type of doping material includes ions that comprise a material selected from the group consisting of germanium (Ge), arsenic (As), phosphorous (P), and boron (B). In a further embodiment, the doped epitaxial layer comprises boron deposited at a concentration of $2 \times 10^{14}$ to $2 \times 10^{15}/cm$. In a further embodiment, the doped well comprises boron implanted at an energy of 30 KeV and at an implant concentration in a range of $1 \times 10^{17}/cm^3$ to $2 \times 10^{18}/cm^3$. In a further embodiment, the halo implant region comprises boron implanted at an energy of 30 KeV and at an implant concentration in a range of $5 \times 10^{18}/cm^3$ to $6 \times 10^{18}/cm^3$. In a further embodiment, the lightly doped drain implant comprises boron implanted at an energy of 30 KeV and at an implant concentration in a range of $1 \times 10^{18}/cm^3$ to $5 \times 10^{18}/cm^3$.

While at least one exemplary embodiment and method of fabrication has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

What is claimed is:

1. A semiconductor device including a semiconductor substrate having a surface comprising:
    a doped epitaxial layer formed on the surface of the substrate;
    a gate electrode disposed overlying the doped epitaxial layer;
    a first impurity doped region disposed within the doped epitaxial layer and partially offset from the gate electrode on a first side of the gate electrode, and implanted using a first type of doping;
    a halo implant region disposed within the first impurity doped region and implanted using the first type of doping;
    a gate overlapped lightly doped drain region disposed within the doped epitaxial layer on a second side of the gate electrode, and implanted using a second type of doping, wherein the second side is opposite the first side, and the second type of doping is opposite the first type of doping;
    a source region formed in the halo implant region, wherein the halo implant region extends beyond the source region, at least partially under the gate electrode, and into a channel area between the source region and a drain region; and
    a drain region formed in the gate overlapped lightly doped drain region, wherein the gate overlapped lightly doped drain region extends beyond the drain region, at least partially under the gate electrode, and into the channel area, and wherein the halo implant region and the gate overlapped lightly doped drain region are separated from each other.

2. The semiconductor device including a semiconductor substrate having a surface as claimed in claim 1, wherein the doped epitaxial layer has a doping concentration of $2\times10^{15}/cm^3$.

3. The semiconductor device of claim 1, wherein the first impurity doped region is a well region formed in the doped epitaxial layer and has a doping concentration in a range of $1\times10^{17}/cm^3$ to $8\times10^{17}/cm^3$.

4. The semiconductor device of claim 1, wherein the halo implant region has a doping concentration in a range of $5\times10^{18}/cm^3$ to $6\times10^{18}/cm^3$.

5. The semiconductor device of claim 1, wherein the gate overlapped lightly doped drain region has a doping concentration in a range of $1\times10^{18}/cm^3$ to $5\times10^{18}/cm^3$.

6. The semiconductor device of claim 1, wherein doping materials selected from the group consisting of germanium (Ge), arsenic (As), phosphorous (P), and boron (B) provide doping for the doped epitaxial layer, the first impurity doped region, the halo implant region, the gate overlapped lightly doped drain region, the source regions, and the drain region.

7. A semiconductor device including a semiconductor substrate having a surface comprising:
    an epitaxial layer doped with a first type of doping material;
    a first doped well on a source side of the substrate, wherein the first doped well is impurity doped with the first type of doping material;
    a gate electrode overlying a surface of the substrate and having a gate dielectric formed therebetween;
    a halo implant region formed in self alignment with the gate electrode on the source side of the substrate and implanted using an impurity ion of the first type of doping material at an angle greater than zero from an axis perpendicular to the surface of the substrate;
    a lightly doped drain implant formed in self alignment with the gate electrode on a drain side of the substrate and impurity doped with a second type of doping material;
    a source region in the halo implant region; and
    a drain region in the lightly doped drain implant, wherein the halo implant region and the lightly doped drain implant extend beyond the source region and the drain region and into a channel area between the source region and the drain region.

8. The semiconductor device of claim 7, wherein the first type of doping material includes ions that comprise a material selected from the group consisting of germanium (Ge), arsenic (As), phosphorous (P), and boron (B).

9. The semiconductor device of claim 7, wherein the first doped well comprises boron implanted at an implant concentration of $1\times10^{15}/cm^3$.

10. The semiconductor device of claim 7, further comprising:
    a second doped well formed within a portion of the first doped well by chain implanting boron at energy of 15K to 500 KeV and at an implant concentration in a range of $1\times10^{17}/cm^3$ to $2\times10^{18}/cm^3$.

11. The semiconductor device of claim 7, wherein the halo implant region comprises boron implanted at an energy of 30 KeV and at an implant concentration in a range of $5\times10^{18}/cm^3$ to $6\times10^{18}/cm^3$.

12. The semiconductor device of claim 7, wherein the lightly doped drain implant comprises boron implanted at an energy of 30 KeV and at an implant concentration in a range of $1\times10^{18}/cm^3$ to $5\times10^{18}/cm^3$.

13. A semiconductor device including a semiconductor substrate having a surface comprising:
    a doped epitaxial layer on the surface of the substrate and doped with a first type of doping material;
    a doped well of the first type of doping material in the doped epitaxial layer and on a source side of the substrate;
    a gate electrode overlying a surface of the substrate and having a gate dielectric formed therebetween;
    a halo implant region formed in self alignment with the gate electrode on the source side of the substrate and implanted using an impurity ion of the first type of doping material at an angle greater than zero from an axis perpendicular to the surface of the substrate;
    a lightly doped drain implant formed in self alignment with the gate electrode on a drain side of the substrate and impurity doped with a second type of doping material;
    an insulating spacer formed about the gate electrode;
    a source region implanted in the halo implant region; and
    a drain region implanted in the lightly doped drain implant, wherein the halo implant region and the lightly doped drain implant extend beyond the source region and the drain region and into a channel area between the source region and the drain region.

14. The semiconductor device of claim 13, wherein the first type of doping material includes ions that comprise a material selected from the group consisting of germanium (Ge), arsenic (As), phosphorous (P), and boron (B).

15. The semiconductor device of claim 13, wherein the doped epitaxial layer comprises boron deposited at a concentration of $2\times10^{14}$ to $2\times10^{15}$/cm.

16. The semiconductor device of claim 13, wherein the doped well comprises boron implanted at an energy of 30 KeV and at an implant concentration in a range of $1\times10^{17}$/cm$^3$ to $2\times10^{18}$/cm$^3$.

17. The semiconductor device of claim 13, wherein the halo implant region comprises boron implanted at an energy of 30 KeV and at an implant concentration in a range of $5\times10^{18}$/cm$^3$ to $6\times10^{18}$/cm$^3$.

18. The semiconductor device of claim 13, wherein the lightly doped drain implant comprises boron implanted at an energy of 30 KeV and at an implant concentration in a range of $1\times10^{18}$/cm$^3$ to $5\times10^{18}$/cm$^3$.

* * * * *